(12) United States Patent
Jones et al.

(10) Patent No.: US 6,622,204 B1
(45) Date of Patent: Sep. 16, 2003

(54) CONTENT-ADDRESSABLE MEMORY WITH CASCADED MATCH, READ AND WRITE LOGIC IN A PROGRAMMABLE LOGIC DEVICE

(75) Inventors: Christopher W. Jones, Pleasanton, CA (US); Steven J. E. Wilton, Vancouver (CA)

(73) Assignee: Cypress Semiconductor Corp., San Jose, CA (US)

( * ) Notice: Subject to any disclaimer, the term of this patent is extended or adjusted under 35 U.S.C. 154(b) by 83 days.

(21) Appl. No.: 09/661,869

(22) Filed: Sep. 14, 2000

(51) Int. Cl.⁷ .................................................. G06F 12/00
(52) U.S. Cl. ..................... 711/108; 711/109; 711/212; 365/78
(58) Field of Search .............................. 711/108, 212, 711/206; 365/78

(56) References Cited

U.S. PATENT DOCUMENTS

| 3,771,139 | A | * | 11/1973 | Digby | 340/172.5 |
|---|---|---|---|---|---|
| 5,440,715 | A | * | 8/1995 | Wyland | 395/435 |
| 5,649,149 | A | | 7/1997 | Stormon et al. | 395/435 |
| 5,765,209 | A | * | 6/1998 | Yetter | 711/207 |
| 5,860,085 | A | | 1/1999 | Stormon et al. | 711/108 |
| 5,946,716 | A | * | 8/1999 | Karp et al. | 711/144 |
| 6,000,008 | A | * | 12/1999 | Simcoe | 711/108 |
| 6,014,732 | A | * | 1/2000 | Naffziger | 711/118 |
| 6,215,685 | B1 | * | 4/2001 | Fung et al. | 365/49 |
| 6,236,585 | B1 | * | 5/2001 | Hill | 365/49 |

* cited by examiner

Primary Examiner—Do Hyun Yoo
Assistant Examiner—Ngoc Dinh
(74) Attorney, Agent, or Firm—Christopher P. Malorana, P.C.

(57) ABSTRACT

An apparatus comprising one or more memory blocks in a programmable logic device. The memory blocks may be configured as content-addressable memory having arbitrarily adjustable tag and data widths.

20 Claims, 7 Drawing Sheets

CONTENT-ADDRESSABLE MEMORY WITH CASCADED MATCH, READ AND WRITE LOGIC IN A PROGRAMMABLE LOGIC DEVICE

FIELD OF THE INVENTION

The present invention relates to a method and/or architecture for content-addressable memories generally and, more particularly, to a method and/or architecture for a content-addressable memory with cascaded match, read and write logic in a programmable logic device.

BACKGROUND OF THE INVENTION

A type of memory commonly used in many types of switching circuits is a content-addressable memory (CAM). Compared to a random access memory, a content-addressable memory (CAM) has a unique method of accessing data words within the memory. In a random access memory, during a read operation, an address is supplied that uniquely identifies one location within the memory. The memory responds with a data word stored in the addressed memory location.

In a content-addressable memory, each stored word consists of two sets of bits: tag bits and data bits. During a read operation of a content-addressable memory, a set of tag bits is supplied. The tag bits supplied are compared to the tag bits stored in every memory location simultaneously. If the supplied tag bits match the tag bits stored in any of the memory locations, the memory array presents an indication that a match has occurred. Once a match has occurred, the tag and data bits in the matching memory word can be read.

Content-addressable memory have been included in programmable logic devices (PLDs). However, conventional content-addressable memories restrict a memory word to a single tag and data width. For many applications, the single tag and data width are not sufficient. In particular, many applications can require tag or data widths that are much wider than are currently available.

One example of a conventional PLD with a CAM can be found in the Altera® APEX™ family of devices (APEX 20K Programmable Logic Device Family Data Sheet, Altera Corp., March 2000, Ver. 2.06). The Altera® APEX™ family of programmable logic devices contain memory blocks, called embedded system blocks (ESB). Each of the embedded system blocks can be configured as a content-addressable memory. When used as a CAM, each block can store 32 words of 32 bits each.

The content-addressable memory blocks in the Altera® APEX™ PLD architecture cannot be combined to implement larger tag widths. The inability to implement larger tag widths is a serious drawback. Many data communications applications require larger tag widths than can be supported by the Altera® APEX™ PLD architecture. For those applications, the Altera® APEX™ PLD architecture will not function effectively.

The Altera® APEX™ PLD CAM blocks can be combined to implement wider data widths. However, doing so leads to a very inefficient use of the memory bits. When the CAM blocks are combined to implement wider data widths, all the tag bits must be duplicated in each block. Since the number of memory blocks can be limited, the inefficient use of memory can cause the Altera® APEX™ PLD CAM blocks to be unusable for many applications that require wide data widths.

Content-addressable memories can be useful in data communication applications. Different data communication protocols have different sizes for source and destination addresses. For example, supporting Ethernet, ATM, SONET, and any other protocols can require different tag and data widths. A programmable logic device with content-addressable memories having arbitrarily adjustable tag and data widths would be desirable.

SUMMARY OF THE INVENTION

The present invention concerns a programmable logic device comprising one or more memory blocks. The memory blocks may be configured as content-addressable memory having arbitrarily adjustable tag and data widths.

The objects, features and advantages of the present invention include providing a method and/or architecture for implementing a content-addressable memory with cascaded match, read and write logic in a programmable logic device that may (i) provide arbitrary tag and data widths, (ii) require little storage overhead, (iii) indicate the start of a new tag using a single storage bit per memory word, and/or (iv) allow a user to efficiently implement wider content-addressable memories.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
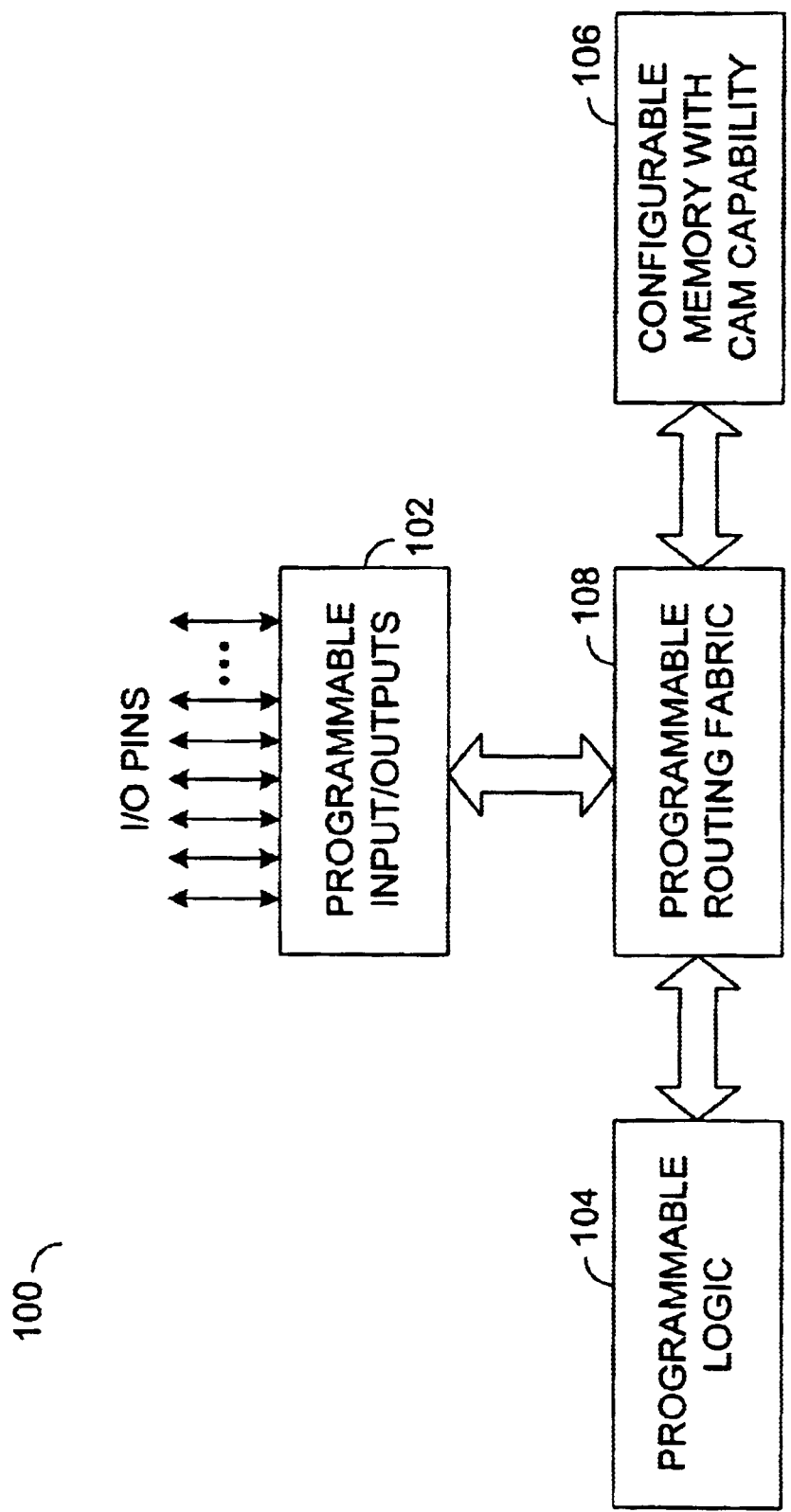
FIG. 1 is a block diagram illustrating a preferred embodiment of the present invention.

Referring to FIG. 1, a block diagram of a circuit 100 is shown in accordance with a preferred embodiment of the present invention. The circuit 100 may be implemented as a programmable logic device (PLD) having one or more memory blocks that may be configured as content-addressable memory with cascaded match, read and write logic. In one example, the circuit 100 may comprise a circuit 102, a circuit 104, a circuit 106, and a circuit 108. The circuit 102 may be implemented as one or more programmable input/output circuits (blocks) that may be used to connect the circuit 100 to the outside world. The circuit 104 may be implemented as one or more programmable logic circuits (blocks) that may be configured with user defined logic.

The circuit 106 may be implemented as one or more configurable memory blocks. The configurable memory blocks may be configured, in one example, as a content-addressable memory (CAM) with cascaded match, read, and write logic. When the circuits 106 are configured as CAMs, a tag and/or a data width of an entry of the CAM may be arbitrarily adjusted (e.g., set to any width desired). For example, a tag and/or data width may be set by a user to be less than, equal to, or greater than a width of a memory word of the circuits 106. The circuits 106 may be concatenated to form larger memory blocks. In general, when the circuits 106 are concatenated to form larger memory blocks, the tag fields of different memory blocks need not be duplicates to allow larger data fields. The circuits 102, 104, and 106 may be connected to each other through a programmable routing fabric 108.

Figure 2:
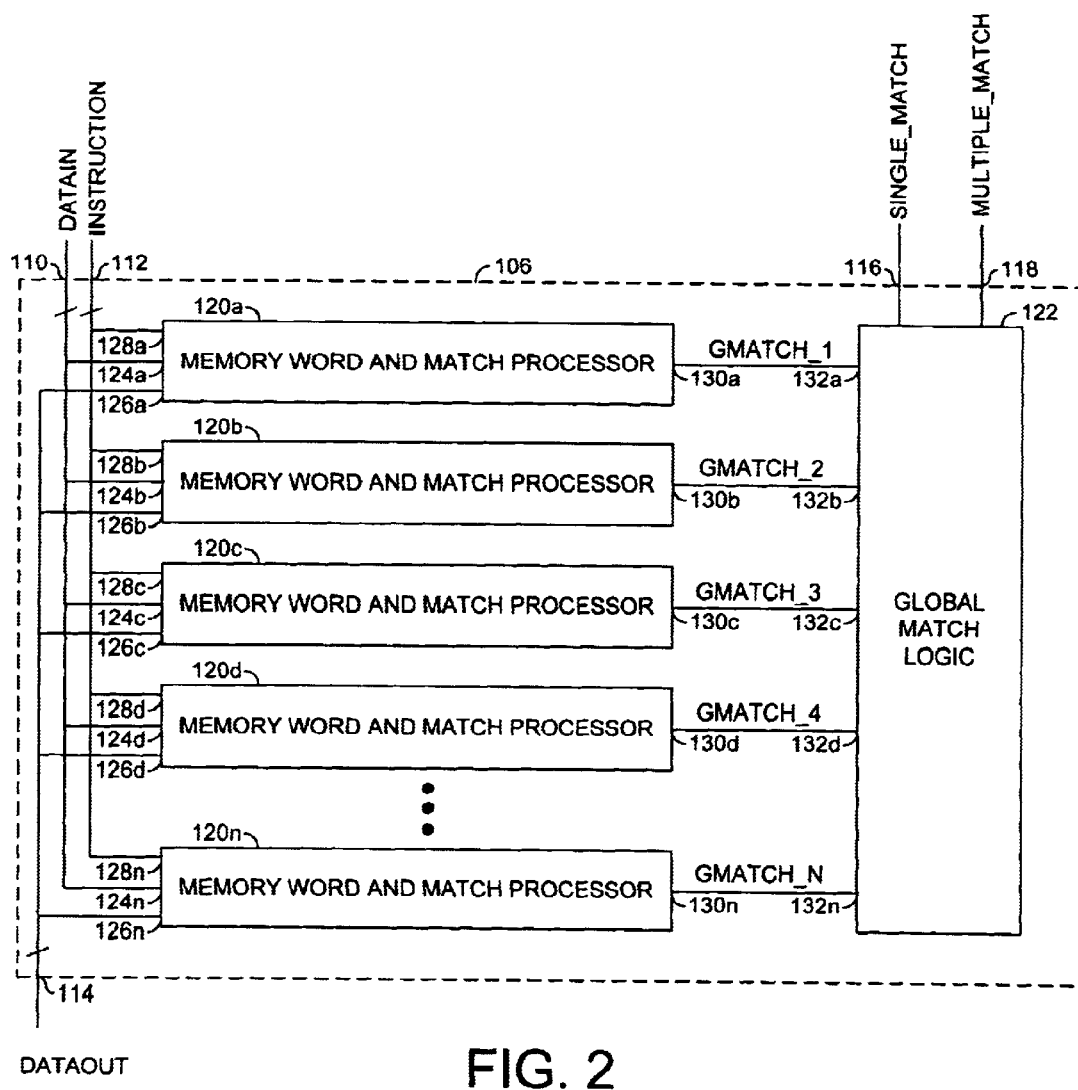
FIG. 2 is a detailed block diagram illustrating a memory array in accordance with a preferred embodiment of the present invention.

Referring to FIG. 2, a block diagram of the circuit 106 of FIG. 1 illustrating a preferred embodiment of the present invention is shown. The circuit 106 may have an input 110 that may receive a signal (e.g., DATAIN), an input 112 that may receive a signal (e.g., INSTRUCTION), an output 114 that may present a signal (e.g., DATAOUT), an output 116 that may present a signal (e.g., SINGLE_MATCH), and an output 118 that may present a signal (e.g., MULTIPLE_MATCH). The signal DATAIN may be, in one example, P-bits wide, where P is an integer. The signal DATAOUT may be M-bits wide, where M is an integer. The integer M may be a factor of the integer P. In one example, M may be equal to 10 and P may be equal to 20. However, other values and ratios of M and P may be implemented to meet the design criteria of a particular application. When M=10 and P=20, the signal DATAIN may be a 20-bit wide signal and the signal DATAOUT may be a 10-bit wide signal. The signal INSTRUCTION may be an x-bit instruction word, where x is an integer. In one example, the signal INSTRUCTION may be implemented as a 5-bit wide control signal. The signal INSTRUCTION may be used as a control input of the circuit 106.

The circuit 106 may comprise a number of circuits 120a–120n and a circuit 122. The circuits 120a–120n may each be implemented as a storage element (e.g., latch, register, etc.) comprising a memory word and match processor circuit. The circuits 120a–120n may be connected to form a content addressable memory array with cascaded match, read, and write logic. The circuit 122 may be a global match logic circuit. The circuits 120a–120n may have an input 124a14 124n that may receive the signal DATAIN, an output 126a–126n that may present the signal DATAOUT, an input 128a–128n that may receive the signal INSTRUCTION, and an output 130a–130n that may present a signal (e.g., GMATCH_1-GMATCH_N). The signals GMATCH_1-GMATCH_N may be used to indicate when a user-presented tag matches a bit pattern contained in a respective memory word.

In one example, each bit in a memory word 120a–120n may be coupled with two bits of the signal DATAIN as an input and one bit of the signal DATAOUT as an output. However, other connections may be implemented to meet the design criteria of a particular application. The circuit 104 may be configured to present the signal DATAIN having a bit pattern that may select whether a bit to be matched is either a "0", a "1", a "don't care", or a "never match". For example, the selection may be made according to the following scheme. When the two bits of the signal DATAIN are "01", a match may occur if the corresponding bit of the memory word 120 is "0". When the two bits of the signal DATAIN are "10", a match may occur if the corresponding memory bit is a "1". If the two bits of the signal DATAIN are "11", a match may occur regardless of the state of the corresponding memory bit. (e.g., a "don't care"). When the two bits of the signal DATAIN are "00", a match may be prohibited regardless of the contents of the corresponding memory bit (e.g., a "never match"). However, other schemes may be implemented accordingly to meet the design criteria of a particular application. During a read operation, each bit in a particular memory word (e.g., 120i) may be presented as a bit of the signal DATAOUT.

The circuit 122 may have a number of inputs 132a–132n that may receive the signals GMATCH_1-GMATCH_N. The circuit 122 may be configured to present (i) the signal SINGLE_MATCH in response to a single one of the memory words 120a–120n matching a number of input tag bits and (ii) the signal MULTIPLE_MATCH in response to more than one of the data words 120a–120n matching the input tag bits. When no data words match the tag bits, the signals SINGLE_MATCH and MULTIPLE MATCH may be de-asserted.

Figure 3:
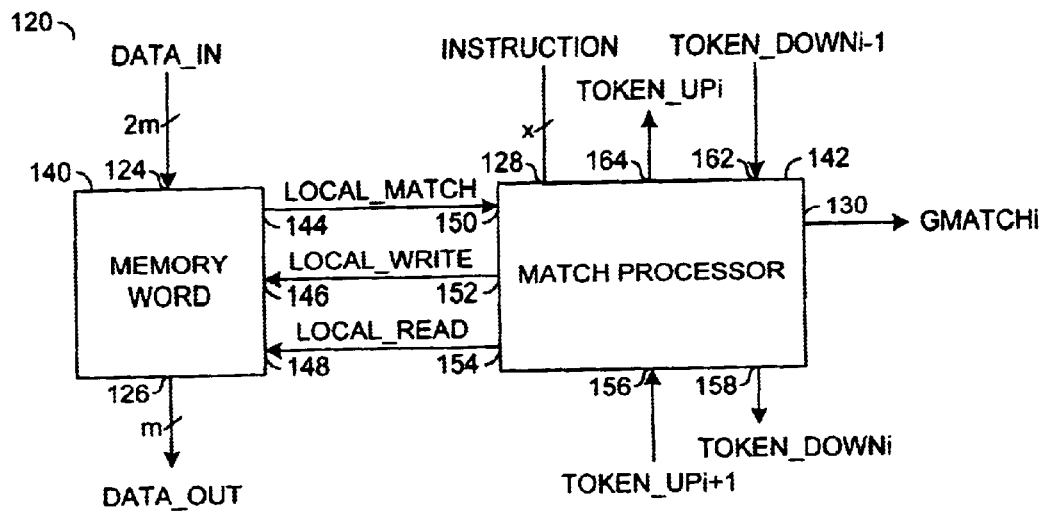
FIG. 3 is a block diagram illustrating a memory word and match processor in accordance with a preferred embodiment of the present invention.

Referring to FIG. 3, a block diagram of a circuit 120 of FIG. 2 illustrating a preferred embodiment of the present invention is shown. In one example, the circuit 120 may comprise a circuit 140 and a circuit 142. The circuit 140 may be implemented as an M-bit wide memory word, where M is an integer. The circuit 140 may be configured to (i) store M-bits of tag and/or data information presented in the signal DATAIN, (ii) present M-bits of data as the signal DATAOUT, and (iii) compare a number of stored bits to a number of bits presented in the signal DATAIN. In one example, M may be 10. The circuit 140 may comprise an M-bit comparator that may compare the signal DATAIN to the data stored in the memory word. The M-bit comparator may be configured to generate a signal (e.g., LOCAL_MATCH) in response to the signal DATAIN matching the stored data. The circuit 142 may be implemented as a match processor. The circuit 142 may be configured to control the circuit 140 in response to the signal INSTRUCTION.

The circuit 140 may have an output 144 that may present the signal LOCAL_MATCH, an input 146 that may receive a signal (e.g., LOCAL_WRITE), and an input 148 that may receive a signal (e.g., LOCAL_READ). The signal LOCAL_MATCH may indicate that an input data pattern matches a stored data pattern. The signals LOCAL_WRITE and LOCAL_READ may be used to control read/write operations of the memory word 140. Each M-bit word 140 may be configured to store either tag information, data information, or both tag and data information. In one example, when a memory word 140 is used to store tag information, the memory word 140 may be referred to as a tag word. When the memory word 140 is used to store data information, the memory word 140 may be referred to as a data word. When the memory word 140 is used to store both tag and data information, the memory word 140 may be referred to as a tag/data word. Different entries stored in the memory 106 may have the same or different tag and/or data widths.

The circuit 142 may have an input 150 that may receive the signal LOCAL_MATCH, an output 152 that may present the signal LOCAL_WRITE, an output 154 that may present the signal LOCAL_READ, an input 156 that may receive a signal (e.g., TOKEN_UPi+1), an output 158 that may present a signal (e.g., TOKEN_DOWNi), an input 162 that may receive a signal (e.g., TOKEN_DOWNi−1), and an output 164 that may present a signal (e.g., TOKEN_UPi). The signal INSTRUCTION may be presented to a number of circuits 142a–142n. The circuit 142 may be configured to generate the signals GMATCH, LOCAL_READ, and LOCAL_WRITE in response to one or more of the signals LOCAL_MATCH, INSTRUCTION, TOKEN_DOWNi−1, and TOKEN_UPi+1. A more detailed description of the operation of the circuit 142 may be found below in connection with FIG. 4.

Figure 4:
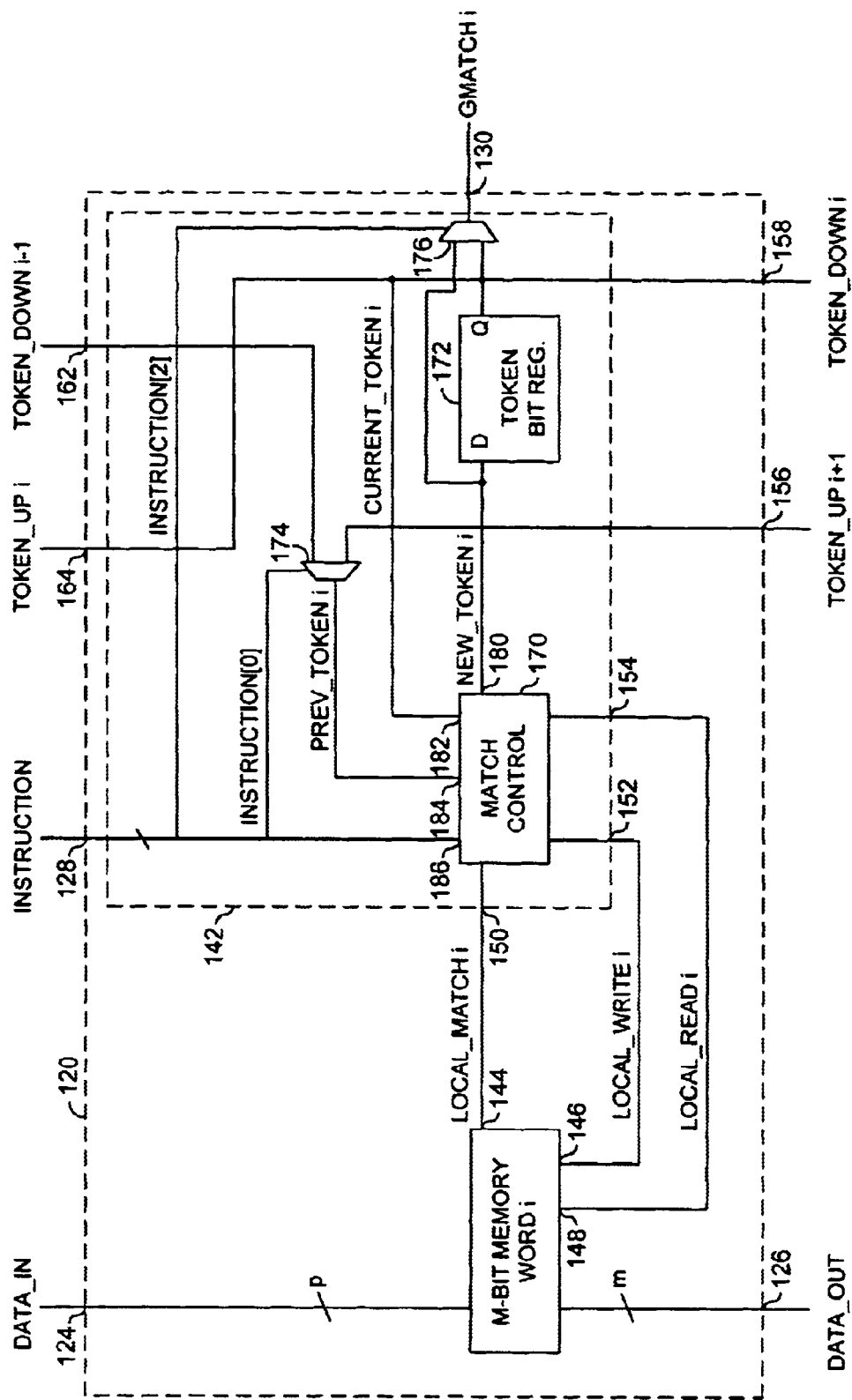
FIG. 4 is a detailed block diagram illustrating a match processor of FIG. 2.

Referring to FIG. 4, a detailed block diagram of a circuit 120 of FIG. 3 illustrating a preferred embodiment of the present invention is shown. The circuit 142 may comprise, in one example, a circuit 170, a register 172, a multiplexer 174, and a multiplexer 176. The circuit 170 may be implemented as a match control circuit. The circuit 170 may comprise Match, read, and write logic circuits. The register 172 may be implemented as a flip-flop. In one example, the register 172 may be implemented as a D-type flip-flop. However, other types of flip-flops, latches or registers may be implemented accordingly to meet the design criteria of a particular application.

For a particular memory word (e.g., 120i), the circuit 170 may have the input 150 that may receive the signal LOCAL_MATCHi, the output 152 that may present the signal LOCAL_WRITEi, the output 154 that may present the signal LOCAL_READi, an output 180 that may present a signal (e.g., NEW_TOKENi), an input 182 that may receive a signal (e.g., CURRENT_TOKENi), an input 184 that may receive a signal (e.g., PREV_TOKENi), and an input 186 that may receive the signal INSTRUCTION. The signal NEW_TOKENi may comprise, in one example, a single bit. The signal NEW_TOKENi may be asserted in response to a match between the contents of the memory word 140 and a number of tag bits presented as the signal DATAIN. The signal NEW_TOKENi may also be asserted in response to the signal PREV_TOKEN being asserted. The signal CURRENT_TOKENi may be a registered version of the signal NEW_TOKENi. The signal PREV_TOKENi may be, in one example, a token bit signal cascaded from another match processor (e.g., TOKEN_DOWNi−1 or TOKEN_UPi+1). The token bit signal may be shifted from one match processor to another match processor in response to a direction bit of the signal INSTRUCTION.

The signal NEW_TOKENi may be presented to a D-input of the register 172. The signal CURRENT_TOKENi may be presented at a Q output of the register 172.

The multiplexer 174 may have a first input that may receive the signal TOKEN_UPi+1, a second input that may receive the signal TOKEN_DOWNi−1, a control input that may receive a portion of the signal INSTRUCTION (e.g., INSTRUCTION[0]), and an output that may present the signal PREV_TOKENi.

The multiplexer 176 may have a first input that may receive the signal CURRENT_TOKENi, a second input that may receive the signal NEW_TOKENi, a control input that may receive a portion of the signal INSTRUCTION (e.g., INSTRUCTION [21]), and an output that may present the signal GMATCHi.

The signal INSTRUCTION may comprise, in one example, a number of logical operation instructions (e.g., MATCH, CASCADE_MATCH, SHIFT_THEN_READ, READ_THEN_SHIFT, READ, SHIFT_THEN_WRITE, WRITE_THEN_SHIFT, WRITE, etc.). An example encoding for the signal INSTRUCTION implemented with 5 bits may be summarized as in the following TABLE 1:

TABLE 1

| INSTRUCTION | Encoding |
| --- | --- |
| MATCH | 00000 |
| CASCADE_MATCH | 0101D |
| SHIFT_THEN_READ | 1001D |
| READ_THEN_SHIFT | 1011D |
| READ | 10000 |
| SHIFT_THEN_WRITE | 1101D |
| WRITE_THEN_SHIFT | 1111D |
| WRITE | 11000 |

A portion of the signal INSTRUCTION (e.g., bit-0) may encode a direction command (e.g., D). In one example, the direction command may indicate the direction of a shift operation (e.g., 0=up, 1=down). Example operations of the circuit 142 in response to various values of the signal. INSTRUCTION may be summarized as in the following TABLE 2:

TABLE 2

| Instruction | Operation |
| --- | --- |
| MATCH | NEW_TOKEN = LOCAL_MATCH<br>LOCAL_READ = 0<br>LOCAL_WRITE = 0 |
| CASCADE_MATCH | NEW TOKEN = PREV _TOKEN AND LOCAL_MATCH<br>LOCAL_READ = 0<br>LOCAL_WRITE = 0 |
| SHIFT_THEN_READ | NEW_TOKEN = PREV_TOKEN<br>LOCAL_READ = PREV_TOKEN<br>LOCAL_WRITE = 0 |
| READ_THEN_SHIFT | NEW_TOKEN = PREV_TOKEN<br>LOCAL_READ = CURRENT_TOKEN<br>LOCAL_WRITE = 0 |
| READ | NEW_TOKEN = CURRENT_TOKEN<br>LOCAL_READ = CURRENT_TOKEN<br>LOCAL_WRITE = 0 |
| SHIFT_THEN_WRITE | NEW_TOKEN = PREV_TOKEN<br>LOCAL_READ = 0<br>LOCAL_WRITE = PREV_TOKEN |
| WRITE_THEN_SHIFT | NEW_TOKEN = PREV_TOKEN<br>LOCAL_READ = 0<br>LOCAL_WRITE= CURRENT_TOKEN |
| WRITE | NEW_TOKEN = CURRENT_TOKEN<br>LOCAL_READ = 0<br>LOCAL_WRITE= CURRENT_TOKEN |

The direction bit D (e.g., INSTRUCTION) of the signal INSTRUCTION may be used, in one example, to control the multiplexer 174. When D=0, the signal TOKEN_DOWNi−1 may be presented to the circuit 170 as the signal PREV_TOKENi. When D=1, the signal TOKEN_UPi+1 may be presented to the circuit 170 as the signal PREV_TOKENi. A portion (e.g., bit-2) of the signal INSTRUCTION may be used to control the multiplexer 176. The multiplexer 176 may present either the signal CURRENT_TOKENi or the signal NEW_TOKENi as the signal GMATCHi. The signal CURRENT_TOKENi may be propagated to (i) a previous match processor as the signal TOKEN_UPi and (ii) a next match processor as the signal TOKEN_DOWNi. The signals TOKEN_UP(i), TOKEN_DOWN(i), TOKEN_UP(i+1), and TOKEN_DOWN(i+1) may be used to cascade a number of the circuits 120a–120n. Cascading the circuits 120a–120n may provide an architecture that may support. arbitrary tag and data widths.

Figure 5:
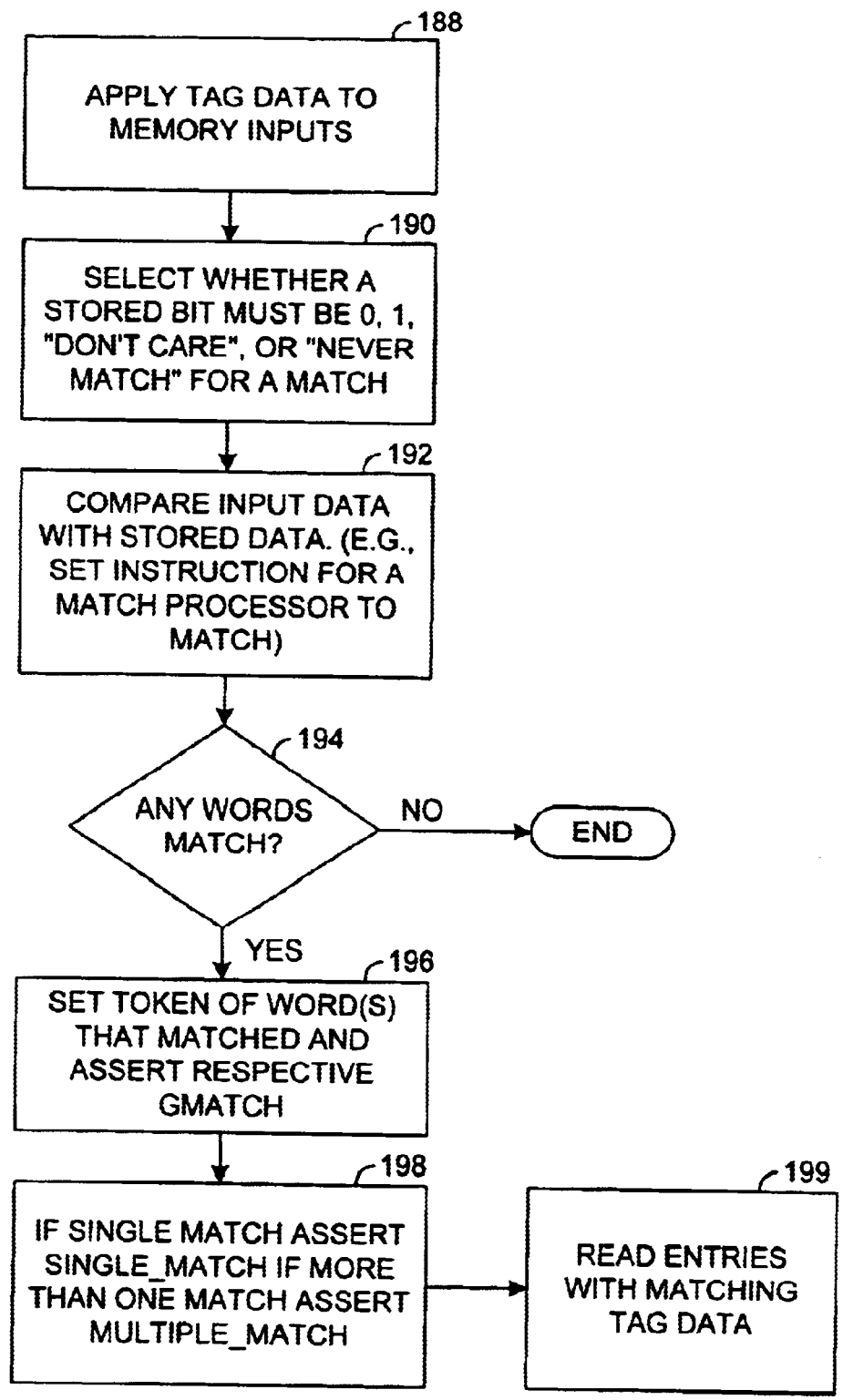
FIG. 5 is a flow chart illustrating an example match operation for tag/data widths less than or equal to a memory word width in accordance with the present invention.

Referring to FIG. 5, a flow diagram illustrating an example read operation of a tag/data word having a combined width that is less than or equal to the width of a memory word is shown. When the tag and data widths combined are less than or equal to the width of a memory word, the entire memory word may be used to store the tag and data. In general, a tag start indicator bit need not be reserved. For example, each of the circuits 120a–120n may be a tag/data word. The circuit 104 may be configured to present the signal INSTRUCTION=READ and a tag field to the memory 106. The memory 106 may be configured to present data associated with the presented tag field. An example read operation of a memory entry that is equal to or less than the width of a memory word may be summarized as follows:

Step 1: The circuit 104 may be configured to present the tag information to the circuit 120 as the signal DATAIN (e.g., block 188). In one example, two bits of the signal DATAIN may be used to specify whether a bit in the memory should be a "0", a "1", a "don't care", or a "never match". For example, the circuit 104 may be configured to specify a "don't care" for bits that make up the data field of the memory word 140 (e.g., block 190).

The circuit 104 may be configured to present the signal INSTRUCTION=MATCH (e.g., block 192). When any single word 120a–120n matches (e.g., block 194), the circuit 170 of the matching word may assert the signal NEW_TOKEN (e.g., set NEW_TOKEN=1), the corresponding signal GMATCHi may be asserted in response to the signal NEW_TOKEN, and the circuit 122 may assert the signal SINGLE_MATCH (e.g., block 196). When more than one of the words 120a–120n matches, the circuit 122 may assert the signal MULTIPLE_MATCH (e.g., block 198).

Step 2: When the circuit 122 asserts either of the signals SINGLE_MATCH or MULTIPLE_MATCH, the circuit 104 may be configured to present the signal INSTRUCTION=READ in response to either of the signals SINGLE_MATCH or MULTIPLE_MATCH (e.g., block 199). The circuit 120 may present the data information stored in the circuit 140 as the signal DATAOUT in response to the read instruction.

Figure 6:
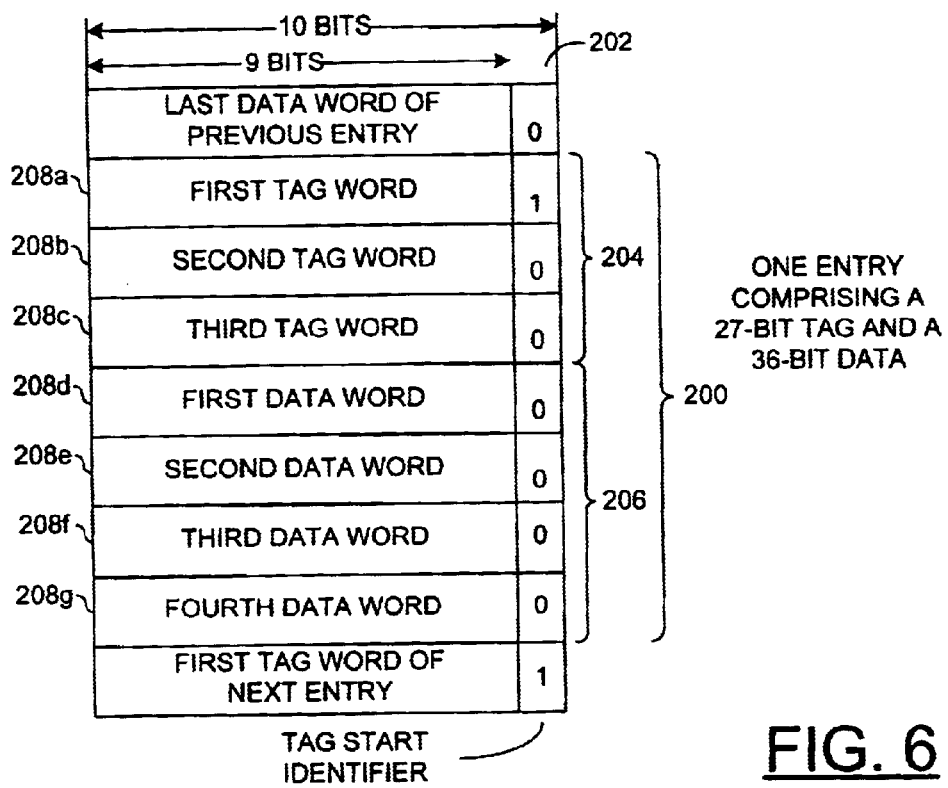
FIG. 6 is a memory map illustrating an example operation of the memory array of FIG. 2 in accordance with a preferred embodiment of the present invention.

Referring to FIG. 6, a memory map illustrating a number of memory words cascaded to provide large tag and data widths in accordance with a preferred embodiment of the present invention is shown. In one example, the, memory words 120a–120n may be implemented as 10-bit wide words. However, any width memory word may be implemented accordingly to meet the design criteria of a particular application. When the tag width or data width of an entry is larger than the width of a memory word, a number of memory words may be cascaded to store the entry (e.g., memory portion 200). When a number of memory words are cascaded, one bit of each memory word may be reserved as a tag start identifier 202. For example, an M-bit memory word may be partitioned into M-1 bits that may be used for tag and/or data information and a single bit that may be used for marking the start of an entry in the content-addressable memory.

In one example, the memory words 120a–120n may be implemented as 10-bits wide. A memory entry may comprise a 27-bit tag field (e.g., portion 204) and a 36-bit data field (e.g., portion 206). Since the number of bits available for storage is generally M-1, the tag and data fields will generally be distributed in M-1 bit portions over a number of words 208. For example, the tag field may occupy three memory words 208a–208c and the data field may occupy four memory words 208d–208g. The tag start identifier bit of the first memory word 208a of the memory entry 200 may be set to a digital 1 to indicate the start of the particular entry.

Figure 7:
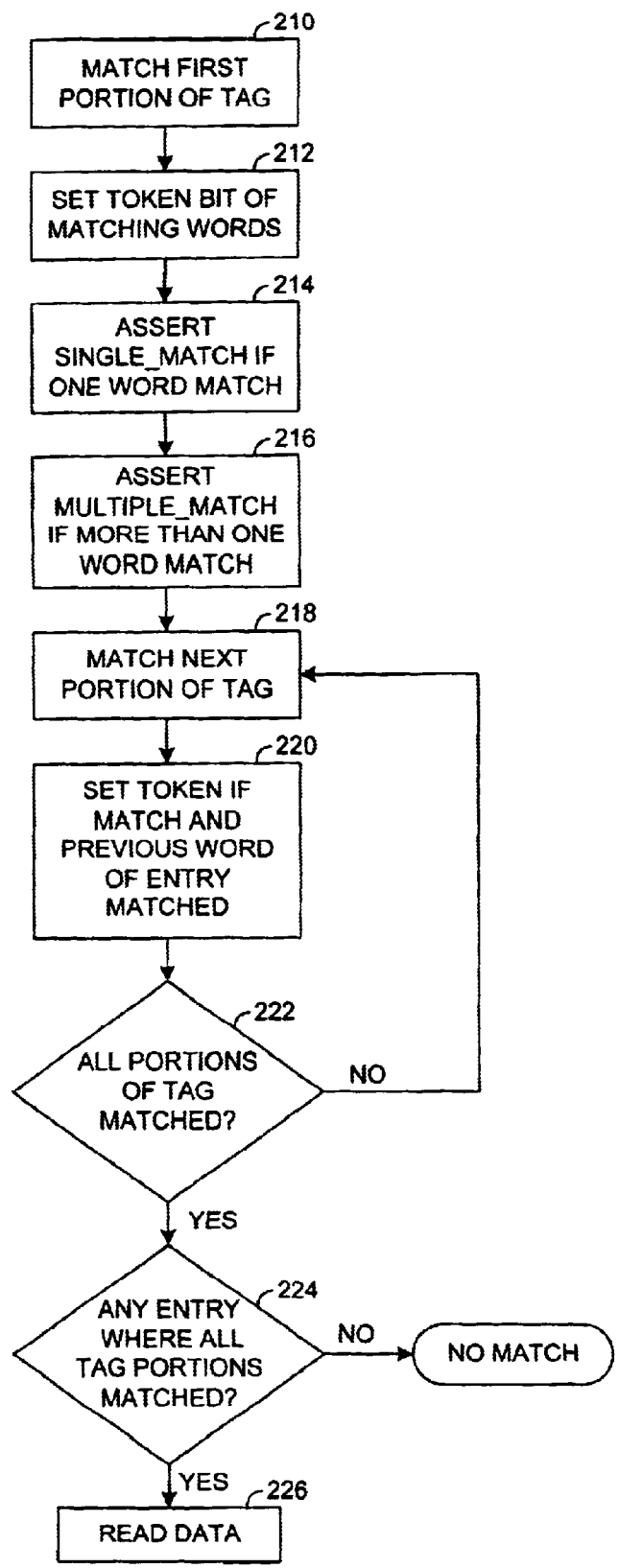
FIG. 7 is a flow chart illustrating an example match operation for tag and/or data widths greater than or equal to a memory word width in accordance with the present invention.

Referring to FIG. 7, a flow diagram-illustrating an example read operation for tag and/or data widths larger than the width of one memory word is shown. As described in the above example, the memory words 120a–120n may be 10-bits wide and each entry may have, in one example, a 27-bit wide tag field and a 36-bit wide data field. However, a content-addressable memory in accordance with the present invention may implement any width tag or data fields to meet the design criteria of a particular application (e.g., the tag and data widths may be arbitrarily adjusted). When a particular entry is to be found and read, the following process may be used:

Step 1: The circuit 104 may present an M-1 bit first portion (e.g., 9 bits) of the tag field as the signal DATAIN (e.g., block 210). The bit of the signal DATAIN corresponding to the tag start identifier bit may be driven with 1 (e.g., only tag and/or tag/data entries that start a tag are potential matches). The circuit 104 may present the signal INSTRUCTION=MATCH.

Step 2: The match logic of the memory words 120a–120n with tag field entries that match the signal DATAIN may assert the signal LOCAL_MATCH. The match control circuit 170 may assert the signal NEW_TOKEN in response to the signal LOCAL_MATCH (e.g., block 212). The circuit 142 may assert the signal GMATCH. The circuit 122 may assert either of the signals SINGLE_MATCH or MULTIPLE_MATCH, depending on whether one, or more than one, of the match processors 142a–142n of the memory words 120a–120n finds a match (e.g., blocks 214 and 216). For example, when the circuits 120a–120n assert one of the signals LOCAL_MATCH_1-LOCAL_MATCH_N and the match control circuits 170 assert one of the signals GMATCH_1-GMATCH_N, the circuit 122 may assert the signal SINGLE_MATCH (e.g., block 214). When the circuits 120a–120n assert more than one of the signals LOCAL_MATCH_1-LOCAL_MATCH_N and the match control circuits 170 assert more than one of the signals GMATCH_1-GMATCH_N, the circuit 122 may assert the signal MULTIPLE_MATCH (e.g., block 216). Since the matching memory word or words 120 will generally be the first portion of the tag data, the circuit 104 may be configured to ignore the signals SINGLE_MATCH and MULTIPLE_MATCH until the entire tag is matched. For the matching memory word or words 120, the signal NEW_TOKEN may be asserted (e.g., set to 1).

Step 3: The circuit 104 may present the next 9 bits of the tag field as the signal DATAIN (e.g., block 218). The bit of the signal DATAIN corresponding to the tag start identifier bit may be driven with 0. The circuit 104 may present the signal INSTRUCTION=CASCADED_MATCH. The direction bit of the signal INSTRUCTION may be set, in one example, to down (e.g., a binary 1).

Step 4: The match processors of the memory words 120a–120n with tag entries (i) matching the data in the signal DATAIN and (ii) having a "1" in the token bit of a preceding word may assert the signal LOCAL_MATCH as described in Step 2. The match control circuit 170 may assert the signal NEW_TOKEN in response to the signal LOCAL_MATCH being asserted and the signal TOKEN_DOWNi, being selected as the signal PREV_TOKEN (e.g., block 220).

Step 5: Steps 3 and 4 may be repeated for the any remaining portions of the tag field (e.g., block 222). After repeating steps 3 and 4, the signal CURRENT_TOKEN=1 may indicate that all the memory words of the tag field may have been matched. Thus, a valid match between the user asserted word and the stored information may be found (e.g., block 224).

Step 6: To read the data stored in the matching memory words 120, the circuit 104 may present the signal INSTRUCTION=SHIFT_THEN_READ (e.g., block 226). The direction bit of the signal INSTRUCTION may be set, in one example, to down (e.g., a binary 1). The match processors 142 having the signal TOKEN_DOWNi-1=1 may assert the signal LOCAL_READ. In addition, a 1 may be shifted into the corresponding circuit 172 (e.g., CURRENT_TOKEN=1).

Step 7: Step 6 may be repeated for the remaining memory words of the entry. In the example illustrated, Step 6 may be repeated three times.

Figure 8:
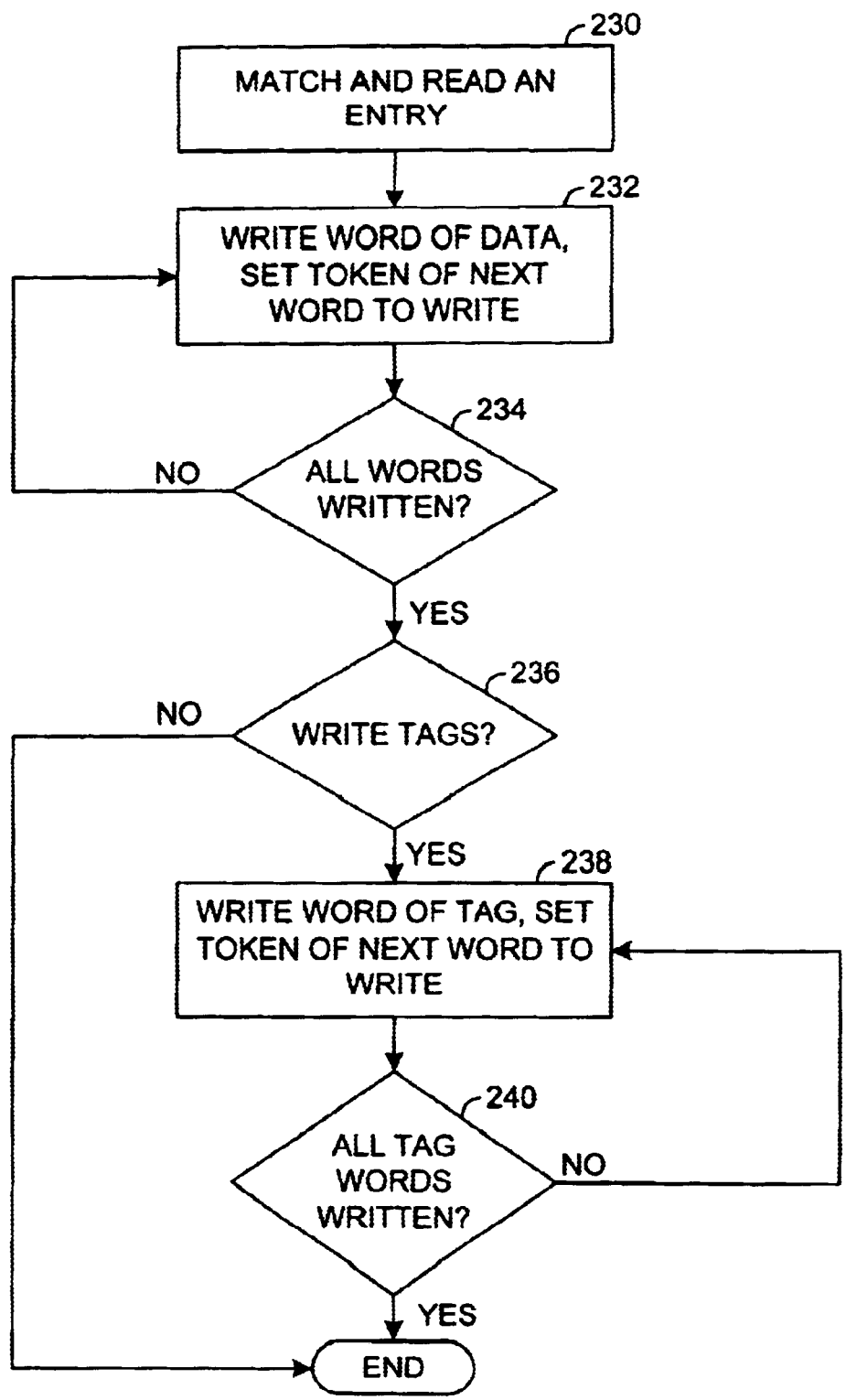
FIG. 8 is a flow chart illustrating an example write operation in accordance with the present invention.

Referring to FIG. 8, a flow diagram illustrating an example writeback or update operation for tag and/or data widths larger than the width of one memory word is shown. When a particular entry is to be written back or updated following a read operation, the following process may be followed:

Step 1: The entry may be matched and a read operation may be performed as described in connection with FIG. 7 (e.g., block 230). When the read operation is completed, the token bit in circuit 172 of the last memory word 208g in a matched entry may be 1 (e.g., CURRENT_TOKEN=1).

Step 2: The circuit 104 may present the signal INSTRUCTION=WRITE_THEN_SHIFT. The direction bit of the signal INSTRUCTION may be a binary 0 (e.g., up). The circuit 104 may present the data to be stored in the memory as the signal DATAIN. The corresponding circuit 170 may then overwrite the final memory word (e.g., word 208g) of the entry. The token is generally shifted one bit in the up direction (e.g., block 232).

Step 3: Step 2 may be repeated for any remaining memory words 120 of the entry (e.g., block 234). The circuit 104 may assert, in one example, the signal INSTRUCTION appropriately to overwrite the tag field as well (e.g., the circuit 104 may assert signal DATAIN for the tag field information and the signal INSTRUCTION=WRITE, blocks 236–240). Other read and write operations may be implemented to meet the design criteria of a user specified circuit implemented in the circuit 104.

The present invention may provide a content-addressable memory architecture that may allow for arbitrary tag and data widths. In addition, the storage overhead required by the scheme presented here may be very small. Only one storage bit (e.g., tag start identifier bit) per memory word may be required to indicate the start of a new tag. Thus, compared to conventional CAM architecture, the present invention may allow a user to implement wider content-addressable memories very efficiently.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a programmable logic device comprising one or more memory blocks configured as content-addressable memory, each memory block comprising a plurality of memory words and having arbitrarily adjustable tag and data widths, wherein (i) when said tag width is equal to or less than a word size of said content-addressable memory, said tag is matched to any word of said content-addressable memory, (ii) when said tag width is larger than said word size of said content-addressable memory, a first portion of said tag is matched to each word of said content-addressable memory having a start of tag indicator, and (iii) when a match is found to said first portion of said tag, one or more remaining portions of said tag is matched to each word of said content-addressable memory without said start of tag indicator.

2. The apparatus according to claim 1, wherein each of said memory words is configured to (i) store a data input, (ii) indicate whether said stored data matches said data input, and (iii) present said stored data, in response to a control input.

3. The apparatus according to claim 1, wherein said tag or data width is larger than a width of said memory word.

4. The apparatus according to claim 1, wherein each of said one or more memory blocks comprise a plurality of storage elements, each of said storage elements comprising one of said plurality of memory words and a receptive one of a plurality of match processors.

5. The apparatus according to claim 4, wherein each of said match processors comprises match, read, and write logic.

6. The apparatus according to claim 4, wherein said respective match processor controls access to said memory word.

7. The apparatus according to claim 4, where in said plurality of match processors are cascaded.

8. The apparatus according to claim 1, wherein said memory blocks contain multiple tag and data widths.

9. The apparatus according to claim 4, wherein each of said match processors is configured to present a first token in response to one or more control signals.

10. The apparatus according to claim 9, wherein said first token is propagated to a previous match processor or a next match processor in response to said one or more control signals.

11. The apparatus according to claim 10, wherein each off said match processors is further configured to receive a second token from said previous or next match processor in response to said one or more control signals and a state of said first token.

12. The apparatus according to claim 9, wherein a state of said first token is set in response to a match between said data input and said stored data.

13. A method for accessing one or more content-addressable memory blocks of a programmable logic device, each memory block having arbitrarily adjustable tag and data widths comprising the steps of:
    (A) when said tag width is equal to or less than a word size of said content-addressable memory said tag to any word of said content-addressable memory;
    (B) when said tag width is larger than said word size of said content-addressable memory, matching a first portion of said tag to each word of said content-addressable memory having a start of tag indicator; and
    (C) when a match is found in step (B), matching one or more remaining portions of said tag to each word of said content-addressable memory without said start of tag indicator.

14. The method according to claim 13, wherein steps B and C are performed using successive clock cycles.

15. The method according to claim 13, wherein the step B comprises the sub-step of:
    (B-1) setting a token associated with said word to a predetermined value when said word contains said first portion and said tag start indicator.

16. The method according to claim 15, wherein the step C further comprises the sub-step of:

(C-1) setting a token of a succeeding word to said predetermined value when (i) said succeeding word contains one of said remaining proportions of said tag and (ii) a token associated with an immediately preceding word is set to said predetermined value.

17. The method according to claim 16, further comprising the step of:
(D) performing an operation upon one or more data words based on a result of steps A, B, or C.

18. The method according to claim 17, wherein said operation comprises reading from said data words.

19. The method according to claim 17, wherein said operation comprises writing to said data words.

20. An apparatus comprising:
means for addressing a plurality of memory words in a programmable logic device by matching a date input with a tag start identifier and contents of said memory words; and
means for cascading said memory words to provide arbitrarily adjustable tag and data widths, wherein (i) when said tag width is equal to or less than a word size of said content-addressable memory, said tag is matched to any word of said content-addressable memory, (ii) when said tag is larger than said word size of said content-addressable memory, a first portion of said tag is matched to each word of said content-addressable memory having said tag start identifier, and (iii) when a match is found to said first portion of said tag, one or more remaining portions of said tag is matched to each word of said content-addressable memory without said tag start identifier.

* * * * *